March 16, 1965 P. H. FOWLER ETAL 3,174,122

FREQUENCY SELECTIVE AMPLIFIER

Original Filed Dec. 12, 1960

*INVENTORS*
PETER H. FOWLER
CAROL KOLM
*BY*

*Blair & Buckles*
ATTORNEYS

3,174,122
FREQUENCY SELECTIVE AMPLIFIER

Peter H. Fowler, Waltham, and Carol Kolm, Bolton, Mass., assignors, by mesne assignments, to Sonus Corporation, a corporation of Delaware
Continuation of application Ser. No. 75,321, Dec. 12, 1960. This application May 7, 1962, Ser. No. 196,840
7 Claims. (Cl. 333—72)

Figures 1, 2, 3, 4, 5:
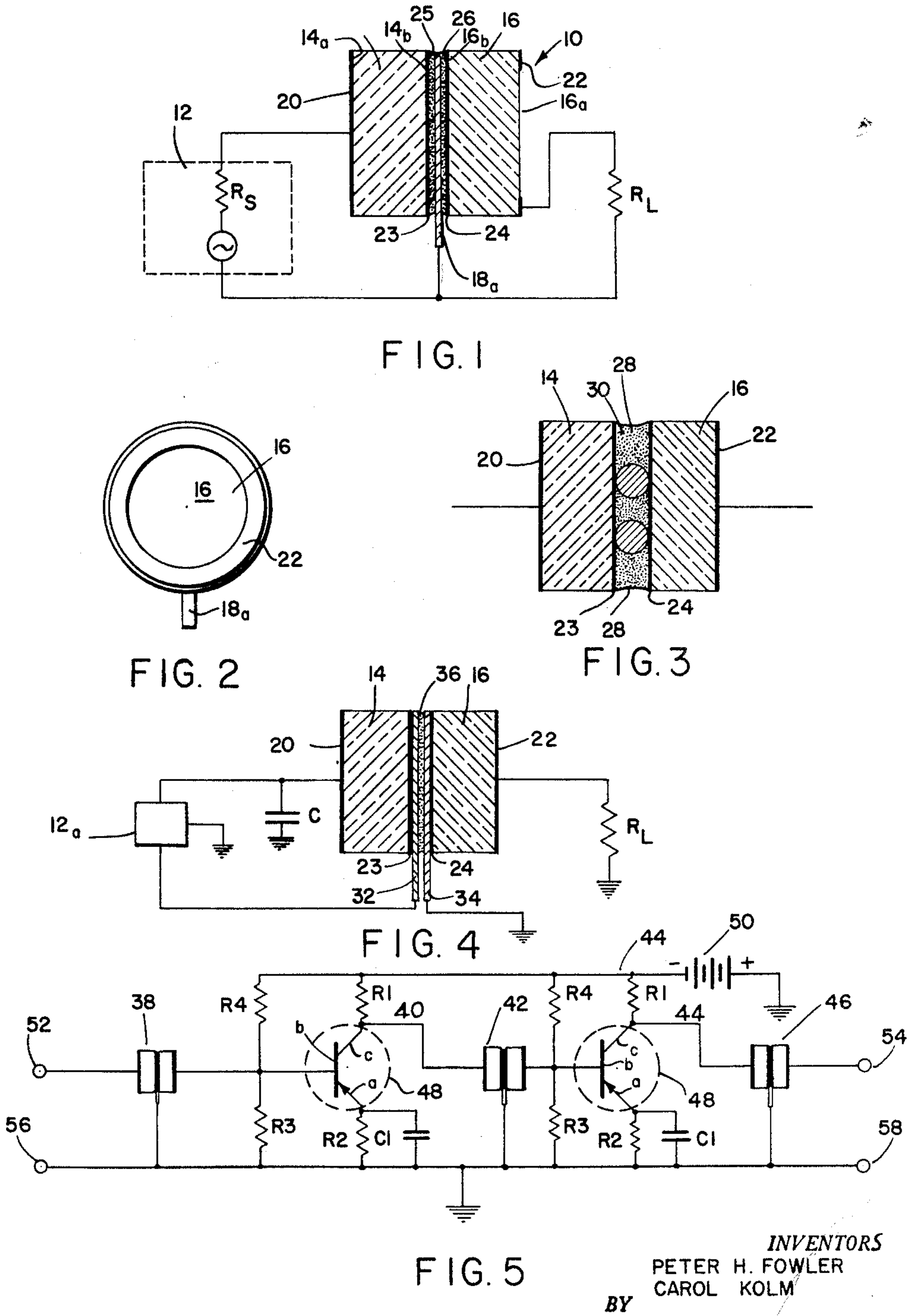

This invention relates to an improved frequency selective multiple stage amplifier and to a novel piezoelectric inter-stage coupling element connected to the input or output of an amplifier stage to control the frequency response thereof. More specifically, it relates to a narrow band amplifier, using as a coupling element a pair of piezoelectric tranducers sandwiched together in a single unit.

An important commercial application of frequency selective amplifiers is in the intermediate frequency sections of radio receivers. The frequency response of such sections is generally limited by means of conventional tuned transformers used as inter-stage coupling elements. In mass produced receivers, these transformers are a significant element of cost. In fact, an intermediate frequency transformer is one of the highest cost components in the entire receiver. Another problem presented by such transformers is their size, which is a limiting factor in the trend to miniaturization.

Prior to the present invention, attempts have been made to use piezoelectric elements to couple the stages of a selective amplifier. In an element of this type, an input transducer converts the electrical output of one stage to an acoustical signal which is coupled to an output transducer. The latter reconverts the acoustical energy to an electrical signal applied to the input of the next stage. One proposed device of this type comprises a single piezoelectric ceramic disk having a common electrode on one face and input and output electrodes on the opposite face. The input signal is applied across the input and common electrodes and the output taken from the output and common electrodes. This construction has failed of commercial adoption primarily because it is difficult to manufacture with reasonable control of frequency characteristics, particularly when aging is taken into account. This problem is due in large part to the fact that, in addition to acoustical coupling between the input and output sections, there is electrical feedthrough as a result of the capacitance between the input and output electrodes.

In an attempt to overcome this problem, a construction was evolved in which separate piezoelectric disks, serving as input and output transducers, are connected by an intervening ceramic stem. However, this configuration, resembling an axle with a pair of wheels affixed thereto, is costly to manufacture. Furthermore, it is subject to a high rate of breakage in handling, and breakage is also a drawback to its use in portable receivers and like devices subject to substantial mechanical shock.

Accordingly, it is a principal object of our invention to provide an improved frequency selective amplifier having a relatively light weight, low cost construction, together with a reduced space requirement.

Another object of our invention is to provide an amplifier of the above type suitable as an intermediate frequency unit in radio receivers, particularly receivers operating in the commercial broadcast band.

A further object of the invention is to provide an amplifier of the above type able to withstand considerable mechanical shock without affecting its operational characteristics.

Yet another object of the invention is to provide an improved frequency sensitive coupling element for an intermediate frequency unit having the above characteristics.

A still further object is to provide a coupling element of the above type capable of low cost manufacture with good control of frequency characteristics.

Other objects of the invention will in part be obvious and will in part appear hereinafter.

The invention accordingly comprises the features of construction, combinations of elements and arrangements of parts which will be exemplified in the constructions hereinafter set forth and the scope of the invention will be indicated in the claims.

For a fuller understanding of the nature and objects of the invention, reference should be had to the following detailed description taken in connection with the accompanying drawings, in which:

FIG. 1 is a general schematic representation of a circuit incorporating the features of our invention, including a piezoelectric coupling element shown in section, FIG. 2 is a side elevation of the coupling element of FIG. 1, showing the electrode arrangement on the output transducer, FIG. 3 is a sectional view of another coupling element which may be used in the circuit of FIG. 1, FIG. 4 is a sectional view, similar to that of FIG. 1, of still another embodiment of our coupling element, and FIG. 5 is a schematic diagram of an intermediate frequency unit made according to our invention.

In general, our amplifier uses as an inter-stage coupling element a pair of ceramic piezoelectric transducers joined together face-to-face in a sandwich construction. There are electrodes on the outer surfaces of the transducers as well as a common electrode between the two inner surfaces. The input signal is applied between the common electrode and one of the outer electrodes, and the output appears between the common electrode and the other outer electrode. The unit is relatively simple to fabricate with conventional techniques, and other important advantages provided by it are ease of control of frequency characteristics, highly efficient transfer of energy between input and output, small size and extreme ruggedness.

Turning now to FIG. 1, a frequency selective circuit incorporating the features of our invention includes a coupling element generally indicated at 10 which couples energy from a source 12 to a load indicated by the resistor $R_L$. The source has an internal impedance shown schematically as a resistor $R_S$. The coupling element 10 is a piezoelectric device comprising polarized ceramic transducers 14 and 16 bonded together by way of a common conductor 18, whose lead **18*a* serves as a common terminal. Input and output electrodes 20 and 22 are formed on the outer faces 14*a* and 16*a* of the transducers, and electrodes 23 and 24 cover the inner faces 14*b* and 16*b***.

More specifically, the electrodes 20–24 may be conventional silver electrodes formed by coating the faces of the transducers 14 and 16 with an organic suspension of silver. The transducers are then heated to burn off the organic material and melt the silver which forms thin films adhering to the faces of the transducers. The conductor 18 is preferably of thin metallic foil, mutually secured to the electrodes 23 and 24 by thin films 25 and 26 of a suitable cement such as a hard-setting epoxy resin capable of transmitting acoustical energy with minimum loss. Before the resin sets, the tranducers 14 and 16 are clamped tightly together to squeeze out excess resin. The clamping also brings the conductor 18 into contact with the electrodes 23 and 24 by way of the small projections invariably to be found on these parts.

The over-all thickness of the bonding system holding the transducers together may be as little as a quarter mil or less. The distance between the transducers should be a small fraction of a wavelength (acoustical) at the operating frequency in order to prevent reflections in the bonding system from significantly affecting the frequency response of the coupling element 10. Preferably, the entire opposing surfaces of the transducers are bonded, so as to maximize acoustical coupling between them. Also, the conductor 18 should extend throughout substantially the entire bonded region, with the exception of a small fillet of cement serving as a hermetic seal. Thus, interfering reflections due to differences in acoustical impedance in the bonding region are minimized. Contact between the conductor 18 and the electrodes adjacent thereto may be enhanced by "loading" the resin with silver particles to render it electrically conductive. In most applications, the transducers will be in the form of circular disks, as shown in FIG. 2.

If the transducers 14 and 16 are polarized in the axial direction, the coupling element 10 can resonate in either of two fundamental modes, as well as harmonics thereof, when excitation is applied between the electrodes 18 and 20. The modes are the axial or thickness mode and the transverse or radial mode. These resonances, which may be termed "internal resonances," correspond to maximum amplitude of vibration of the element 10 for a given voltage at the source 12. Each internal resonance is a composite of a mechanical resonance and an electrical resonance slightly spaced apart in frequency. At the electrical resonance, the alternating current through the transducer 14 for a given voltage is at a maximum, and, at the mechanical resonance, the acoustical output for a given current is maximized. Between these two resonances is a frequency at which a given voltage provides maximum acoustical output. This is the frequency of the internal resonance. It should be noted that the electrical resonance has no direct connection to the capacitance between the electrodes 18 and 20.

With axial polarization, the alternating voltage between the electrodes 20 and 18 causes expansion and contraction of the transducer 14 in the axial direction. It will be apparent that, with the internal compliance and mass of the unit, there is a thickness resonance mode in this direction. The radial mode results from the fact that, as the transducer 14 expands and contracts in the axial direction, it contracts and expands in the radial direction according to Poisson's ratio. This effect is at a maximum at a frequency generally different from that of the thickness resonance. More particularly, the frequency of the thickness resonance depends, for a given material, on thickness, and the frequency of the radial resonance depends on the diameter. The coupling element may also be operated in the shear mode, in which case the transducers 14 and 16 are polarized in the transverse direction for the electrode configuration of FIG. 1.

The vibrations resulting from electrical excitation of the transducer 14 are coupled to the transducer 16, where they result in an output voltage between the electrodes 22 and 18. The output voltage is a function of vibrational amplitude and, therefore, is at a maximum at the resonant frequencies of the coupling element 10. The coupling element therefore operates as a tuned filter between the source 12 and load resistor $R_L$.

The frequency response of a circuit employing our coupling element may be "shaped" in a number of ways. For example, the resonant frequencies of a number of coupling elements operating in succession on the signal may be staggered in any desirable fashion, as is done with conventional tuned transformers.

Another method of shaping response is to taper the coupling elements. For example, when operating in the thickness mode, the thickness of the transducer 14 may be continuously varied from point to point, so that resonance occurs over a band of frequencies. Alternatively, the thickness may undergo stepwise variations, in which case a number of discrete, closely spaced resonance frequencies may be provided. Where the radial mode is used, a simple way to accomplish the desired result is to provide an oval, rather than circular, transverse configuration for the transducers.

We have found that maximum power is delivered to the coupling element 10 at resonance when the input impedance of the coupling element is matched to the source resistance $R_S$. The input impedance is a function of the capacitance between the electrodes 20 and 18, and, therefore, it may be varied by altering the radius of the transducer 14. However, there is a limit to impedance variation in this manner. In radio receiver applications, the thickness and radial resonances should not be close in frequency. This may be prevented by having the diameter of each transducer at least ten times as great as the thickness thereof. Where this limitation prevents the reduction of diameter for matching of input impedance to source impedance, the area of the electrode 20 may be reduced to accomplish an impedance match. The electrode 20 should then be centered on the face 14*a* of the transducer 14, since the conversion of electrical to acoustical energy is more efficient in the central portion of the transducer than along the edges thereof.

On the other hand, maximum transfer of energy to the load resistor $R_L$ does not call for an impedance match. Rather, the output impedance of the coupling element 10 should be substantially greater than the resistance $R_L$. This can be explained from the fact that the output impedance is inversely related to the capacitance between the electrodes 22 and 18. The charge developed across a piezoelectric transducer is proportional to the force and independent of the capacitance. If the capacitance is small, corresponding to a high output impedance, the voltage for a given charge will be greater. There is a corresponding increase in current through the load and power delivered thereto.

The use of a radial dimension substantially greater than the thickness or axial dimension, as suggested above in connection with filter applications, as in radio receivers, militates toward use of the radial mode. If the thickness mode is used in such a case, a number of harmonics of the radial resonance may fall within or near the frequencies of operation, resulting in interference by unwanted signals.

The most practical way to overcome this problem would be to make the diameter so much greater than the thickness that only very high, and thus largely attenuated, radial harmonics correspond to the thickness resonance. However, at the relatively low frequencies used in intermediate frequency amplifiers (e.g., 455 kilocycles), the thickness mode requires a considerable axial dimension. This, in turn, would result in an over-all size which is too large for small packaging, as in radio receivers.

Moreover, when the thickness becomes great, a relatively high voltage or a relatively long time is required to polarize each transducer.

Accordingly, the radial mode is generally preferred in low frequency operation. It will be noted that with the relative thickness-radial dimensions given above, all thickness resonances are at frequencies substantially above the radial resonance utilized in the coupling element.

At higher frequencies, i.e., above approximately one megacycle, use of the radial mode is limited, in many cases, by the extremely small diameter required for resonance. Also, in some low frequency applications, the thickness mode is preferred, particularly when it is desired to take advantage of the closer coupling between an electrical input (or output) in the axial direction and mechanical operation in the same direction.

Another advantage of the radial mode in the constructions described herein is the tighter acoustical coupling it provides between the two transducers used in the coupling element. That is, with electrically-excited radial vibrations in the transducer 14, the bonding of the face 14*b* to the face 16*b* constrains the transducer 16 to vibrate in unison. In a simple unit operating in the thickness mode, on the other hand, part of the acoustical energy goes into coherent translatory motion of the transducer 16, rather than vibratory motion. The over-all efficiency is therefore substantially less.

Assuming that the electrode 22 covers the entire surface 16*a* of the transducer 16, the capacitance between the electrodes 22 and 18 may be minimized by reducing the diameter or increasing the thickness of the transducer 16, depending upon whether the thickness or radial resonance mode is being used. However, as pointed out above, there is a practical limit on the ratio of diameter to thickness, and this imposes an upper limit on load resistance for efficient use of the coupler 10 if output impedance is to be modified only in this manner. Furthermore, fabrication of the coupling element is simpler if the transducer 14 has the same transverse dimensions as the transducer 16, i.e., if the transducers are congruent.

However, the capacitance between the electrodes 22 and 18 may also be reduced by decreasing the portion of the surface 16*a* covered by the electrode 22. If the reduction is effected in certain ways, there is essentially no change in the charge developed across the transducer 16. One way is to fabricate the electrodes in the form of a grid covering the entire surface 16*a*. The grid appears as a solid film for piezoelectric purposes and as an open grid insofar as capacitance is concerned. With the axial mode of operation, a preferable method is to form the electrode 22 as an annulus extending around the outer portions of the surface 16*a*, as shown in FIGS. 1 and 2. Thus, the amplitude of vibration, and therefore the force thereof, is substantially greater in the outer portions of the transducer 16 than in the central portions thereof. Therefore, most of the charge is developed in the outer portions, and little charge is lost by eliminating the central portion of the electrode 22.

Illustratively, a circuit operating according to the above criteria may have a source impedance of 2200 ohms and a load impedance of 600 ohms. For a pass band at 465 kilocycles, with operation in the radial resonance mode, the coupling unit 10 may include a pair of transducers of 0.025 inch thickness each and 0.210 inch diameter for a transducer material having a dielectric constant of 1200 and a mechanical Q of 350. With 30 percent coupling between the external electrical and internal mechanical systems, the coupling unit has an input impedance of 2200 ohms with full size electrodes, thus matching the source impedance. The output impedance is also 2200 ohms, which is sufficiently greater than the load impedance to provide almost optimum power transfer to the load. The coupling element is preferably supported by the leads attached thereto to minimize external effects on the vibrations therein.

An important advantage of the above circuit stems from the fact that there is no electrical feedthrough from the input of the coupling element 10 to the output thereof. The common conductor 18 shields the electrodes 20 and 22 from each other. Thus, the areas of the electrodes 20 and 22 may be varied, as described above, without affecting the coupling between the input and output of the element 10. This considerably mitigates design problems and simplifies manufacturing practices. As a result of this and also because of the simple construction involved, the element 10 may be fabricated at minimum cost. In fact, the cost of manufacture is substantially less than that of conventional, tuned, intermediate frequency transformers. At the same time, the efficiency of the coupling element is considerably greater than that of conventional transformers, and, where desired, the effective Q may be made much greater than that of the tuned circuits ordinarily used. Moreover, a 465 kilocycle unit may be constructed with a total volume of approximately 0.00075 cubic inch, one hundredth the volume of a conventional miniature intermediate frequency transformer.

Another satisfactory inter-transducer structure is shown in FIG. 3, in which a pair of wires 28 contact both the electrodes 23 and 24, while a cementitious layer 30, which may be of epoxy resin, pervades the space between the wires to hold the structure together. The wire size has been exaggerated for the sake of clarity; actually the wires should be very small, e.g., 0.003 inch, so as to minimize the problem of internal reflections, as noted above.

In FIG. 4, the transducers 14 and 16 have electrodes on their inner surfaces in a manner similar to the electrodes of FIG. 1. Leads 32 and 34 are soldered to the electrodes, and the unit is held together by a cement film 36, thick enough to separate the electrodes 23 and 24. The leads 32 and 34 may be connected together so that the electrodes 23 and 24 operate as a single electrode. On the other hand, in some circuits it may be desirable to have a degree of electrical isolation between the electrodes 23 and 24, in which case the leads 32 and 34 will not be interconnected.

For example, as shown in FIG. 4, a source 12*a* may have a balanced output connected to the electrodes 20 and 23. The output is taken from the electrodes 22 and 24, and a capacitor C balances the capacitance between the electrodes 23 and 24. It is noted that, again, there is no capacitive feedthrough from input to output.

In some cases it may be desirable to form the transducers 14 and 16 as an integral structural unit. In such case the center electrode might be formed by diffusing electrically conducting material into the ceramic. Another method of forming such a unit is to insert wire or metallic powder between the transducers prior to firing the entire unit.

FIG. 5 is a detailed schematic diagram of the two-stage intermediate frequency amplifier constructed according to our invention. The amplifier includes an input coupling element 38 of the type described above, a first amplifying stage generally indicated at 40, a second coupling element 42, a second stage generally indicated at 44 and an output coupling element 46. The stages 40 and 44 may be identical, comprising transistors 48 having emitters 48*a*, bases 48*b* and collectors 48*c*. Collector potential is derived from a power supply, indicated as a battery 50, by way of load resistors R1. Emitter resistors R2, connected to the battery 50 by way of a ground connection, are bypassed by capacitors C1.

The bases 48*b* are returned to ground through resistors R3, and base-emitter bias current is supplied by means of resistors R4, connected between the bases 48*b* and the battery 50. The coupling element 38 is connected between an input terminal 52 and the base 48*b* of the stage 40, while the coupling element 42 is between the collector of the first stage and the base of the second stage. The coupling element 46 is connected between the collector of the second stage and an output terminal 54. A second input terminal 56 and a second output terminal 58 are grounded. The transistors 48 may be type 2N373, and the various other components may have the following values:

| | | |
|---|---|---|
| R1 | ohms | 3900 |
| R2 | do | 1000 |
| R3 | do | 2000 |
| R4 | do | 15,000 |
| C1 | μf | .01 |

The inter-transducer construction of FIG. 3 may be used with 0.003 inch silver wire embedded in the epoxy cement between the transducers. The transducers are fully silvered on both flat surfaces. They have the characteristics specifically set forth above.

Assuming the above values, the transducers have input and output impedances of 2200 ohms, as noted, and the stages 40 and 44 have input and output impedances of 500 and 2200 ohms, respectively. The voltage gain from the terminal 52 to the collector of the first stage is seven, and the same gain is obtained from the latter point to the collector of the second stage. The bandwidth of the amplifier is 12 kilocycles at 6 db, with the coupling elements 38, 42 and 46 tuned to the same frequency. The bandwidth may be increased by resort to the methods discussed above.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

This application is a continuation of our copending application Serial No. 75,321, filed December 12, 1960.

We claim:

1. An electric circuit comprising, in combination, an alternating current source developing a signal at a given frequency, a load, a coupling element comprising first and second thin, axially polarized ceramic disks, each of said disks having first and second faces, bonding means securing said first faces together in a closely spaced face-to-face relation, said bonding means including a conducting medium extending between said first faces, said bonding means having a thickness less than the acoustical wavelength at the operating frequency of said coupling element, and said bonding means covering substantially the entire opposing faces of said disks so as to mechanically couple together the entirety of said disks thereby obtaining close acoustical coupling between them, an input electrode on one of said second faces, an output electrode on the other of said second faces, the impedance of said coupling element between said conducting medium and said input electrode being substantially matched to the impedance of said source, the impedance of said coupling element between said conducting medium and said output electrode being substantially greater than the impedance of said load, said coupling element being dimensioned to have an internal radial resonance at said frequency, means connecting said conducting medium and said input electrode to said source, and means connecting said conducting medium and said output electrode to said load.

2. An electric circuit comprising in combination an alternating current source developing a signal at a given frequency, a load, a coupling element comprising first and second axially polarized ceramic disks, each of said disks having first and second faces, bonding means securing said first faces together in a closely spaced face-to-face relation, said bonding means including a conducting medium extending between said first faces, said bonding means having a thickness substantially less than the acoustical wavelength at the operating frequency of said coupling element, and said bonding means covering substantially the entire opposing faces of said disks so as to mechanically couple together the entirety of said disks, thereby obtaining close acoustical coupling between them, and input electrode on one of said second faces, an output electrode on the other of said second faces, the impedance of said coupling element between said conducting medium and said input electrode being substantially matched to the impedance of said source, the impedance of said coupling element between said conducting medium and said output electrode being substantially greater than the impedance of said load, said coupling element being dimensioned to have an internal thickness resonance at said frequency, means connecting said conducting medium and said input electrode to said source, and means connecting said conducting medium and said output electrode to said load.

3. A coupling element comprising first and second axially polarized ceramic discs, each of said discs having first and second faces, bonding means securing said first and second faces together in closely spaced face-to-face relation, said bonding means including a conducting medium extending between said first faces, said bonding means having a thickness less than the acoustical wavelength at the operating frequency of said coupling element and said bonding means covering substantially the entire opposing faces of said disks so as to mechanically couple together the entirety of said disks, thereby obtaining close acoustical coupling between them, an input electrode on one of said second faces, an output electrode on the other of said second faces, said coupling element being dimensioned to have an internal resonance.

4. The combination defined in claim 3 in which said conducting medium includes metallic films on said first faces and a sheet of metallic foil disposed between said films and in contact therewith.

5. The combination defined in claim 4 in which said bonding means includes electrically conducting cement between said foil and said first face.

6. The combination defined in claim 3 in which said bonding means includes metallic films on said first surfaces, a fine wire in contact with both of said films and cement in the spaces around said wire.

7. The combination defined in claim 3 in which said bonding means includes metallic films on said first faces, a nonconducting layer of cement between said metallic films and means connecting said films together.

References Cited by the Examiner

UNITED STATES PATENTS

| | | | |
|---|---|---|---|
| 2,267,957 | 12/41 | Sykes | 333—72 |
| 2,830,274 | 4/58 | Rosen | 333—72 |
| 2,877,432 | 3/59 | Mattiat | 333—72 |
| 2,974,296 | 3/61 | Rosen | 333—72 |
| 2,976,501 | 3/61 | Mattiat | 333—72 |
| 2,988,714 | 6/61 | Tebon | 333—72 |
| 3,051,919 | 8/62 | Faulk et al. | 333—32 |

References Cited by the Applicant

"Barium Titanate and Its Applications," published by OHM-sha Co., Ltd., September 1955, pages 153–156.

HERMAN KARL SAALBACH, *Primary Examiner.*